(12) United States Patent
Kasuya et al.

(10) Patent No.: US 8,319,193 B2
(45) Date of Patent: Nov. 27, 2012

(54) CHARGED PARTICLE BEAM APPARATUS, AND METHOD OF CONTROLLING THE SAME

(75) Inventors: Keigo Kasuya, Kokubunji (JP); Takashi Ohshima, Saitama (JP); Souichi Katagiri, Kodaira (JP); Shigeru Kokubo, Mito (JP); Hideo Todokoro, Hinode (JP)

(73) Assignee: Hitachi High-Technologies Corporation, Tokyo (JP)

( * ) Notice: Subject to any disclaimer, the term of this patent is extended or adjusted under 35 U.S.C. 154(b) by 83 days.

(21) Appl. No.: 12/999,075

(22) PCT Filed: Jun. 10, 2009

(86) PCT No.: PCT/JP2009/002620
§ 371 (c)(1),
(2), (4) Date: Dec. 15, 2010

(87) PCT Pub. No.: WO2009/153939
PCT Pub. Date: Dec. 23, 2009

(65) Prior Publication Data
US 2011/0089336 A1  Apr. 21, 2011

(30) Foreign Application Priority Data
Jun. 20, 2008 (JP) .................... 2008-161584

(51) Int. Cl.
*H01J 27/26* (2006.01)
(52) U.S. Cl. .................... 250/423 F; 250/310
(58) Field of Classification Search ........... 250/423 F, 250/310
See application file for complete search history.

(56) References Cited

U.S. PATENT DOCUMENTS
3,786,268 A  1/1974 Nomura
(Continued)

FOREIGN PATENT DOCUMENTS
JP  47-037060  11/1972
(Continued)

OTHER PUBLICATIONS

A.V, Crewe et al., "Electron Gun Using a Field Emission Source", Rev. Sci. Instr. vol. 39, No. 4, (Apr. 1968), pp. 576-583.
(Continued)

*Primary Examiner* — Kiet T Nguyen
(74) *Attorney, Agent, or Firm* — Antonelli, Terry, Stout & Kraus, LLP.

(57) ABSTRACT

Provided is a charged particle beam apparatus, which can emit a stable electron beam, having high brightness and a narrow energy width. The charged particle beam apparatus comprises a field emission electron source, electrodes for applying an electric field to the field emission electron source, and a vacuum exhaust unit for keeping the pressure around the field emission electron source at 1 10–8 Pa or less. The apparatus is so constituted as to use such one of the electron beams emitted as has an electron-beam-center radiation angle of $1 \times 10^{-2}$ sr or less, and to use the electric current thereof, the second order differentiation of which is negative or zero with respect to the time, and which reduces at a rate of 10% or less per hour. The charged particle beam apparatus further comprises a heating unit for the field emission electron source, and a detection unit for the electric current of the electron beam. The field emission electron source is repeatedly heated to keep the electric current of the electron beam to be emitted, at a predetermined value or higher.

11 Claims, 14 Drawing Sheets

U.S. PATENT DOCUMENTS

| | | |
|---|---|---|
| 3,945,698 A | 3/1976 | Fukuhara et al. |
| 4,833,362 A | 5/1989 | Crewe |
| 5,442,183 A * | 8/1995 | Matsui et al. ............ 250/441.11 |
| 7,781,743 B2 | 8/2010 | Katagiri et al. |
| 2006/0231773 A1 | 10/2006 | Katagiri et al. |
| 2007/0158588 A1 | 7/2007 | Zhou et al. |
| 2009/0294697 A1 | 12/2009 | Katagiri et al. |

FOREIGN PATENT DOCUMENTS

| | | |
|---|---|---|
| JP | 52-141558 | 11/1977 |
| JP | 3-505386 | 11/1991 |
| JP | 2002-216686 | 8/2002 |
| JP | 2006-294481 | 10/2006 |
| JP | 2007-73521 | 3/2007 |
| JP | 2007-172862 | 7/2007 |
| JP | 2008-140623 | 6/2008 |
| JP | 2009-4112 | 1/2009 |
| JP | 2010-10125 | 1/2010 |

OTHER PUBLICATIONS

B. Cho et al., Measurement of pressures in $10^{-10}$ Pa range from the damping speed of field emission current, Applied Physics Letters, 2007, vol. 91, 012105-014.

* cited by examiner

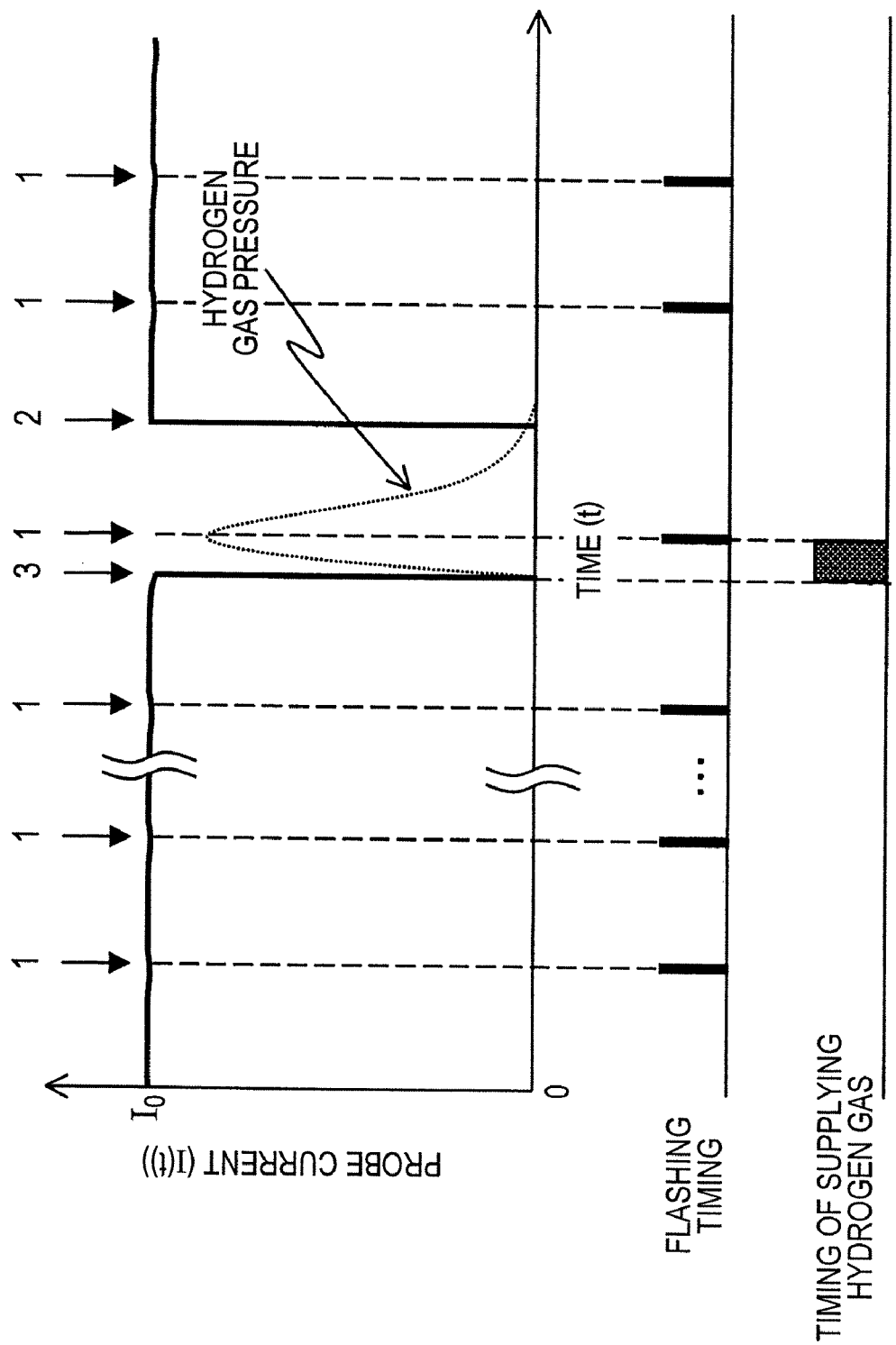

CHARGED PARTICLE BEAM APPARATUS, AND METHOD OF CONTROLLING THE SAME

TECHNICAL FIELD

The present invention relates to a charged particle beam apparatus such as an electron microscope having a field emission electron gun (FEG), and more particularly, to a charged particle beam apparatus for stabilizing current of electron beams and a method for controlling the same.

BACKGROUND ART

When a positive voltage is applied from a facing electrode to a metal processed to be in a needle shape, an electric field is concentrated on a front end of the metal. When a strength of the electric field is about $10^7$ V/cm, free electrons in the metal may escape a potential barrier of the surface due to the tunneling effect and be externally emitted. This phenomenon is referred to as a field emission.

An apparatus for acquiring electron beams by the field emission is referred to as a field emission electron gun (FEG). As for an electron source of the FEG, tungsten beam formed of a single crystal that is sharpened to be in a needle shape is generally used and is used at room temperature. The electron source and an extraction electrode facing the electron source are installed in a vacuum container and an electron is emitted by applying an extraction voltage to the electron source and the extraction electrode. The emitted electron is accelerated at a high pressure applied to an acceleration electrode to form an electron beam.

An element of determining a performance of the FEG includes a brightness and an energy spread. The brightness indicates an amount of electron beam as a value indicating how much an electron beam of current can be obtained per unit solid angle, from the electron source per unit area. The energy spread indicates a monochromaticity of an electron beam as a range of wavelengths of the electron beam. Since the FEG can obtain an electron beam having a high brightness and a narrow energy spread compared to other thermionic emission type or Schottky emission electron gun, the FEG is used, as a high resolving power electron gun, for the charged particle beam apparatus such as a scanning electron microscope (SEM) or a transmission electron microscope (TEM).

As a problem of the FEG, it is known that emission current is unstable. FIG. 1 illustrates a representative time change of current. The same time change is disclosed in patent document 1. Current emitted from the clean surface of an electron source significantly decreases immediately after the emission and continues its gradual decrease even after the significant decrease. Next, noise starts occurring in the current and increases over time. Then, the current changes to increase and noise further increases. A period where a decrease in current is significant, which is indicated by A in FIG. 1, is referred to as a decreasing region, and a period where the decrease in current is gradual, which is indicated by B in FIG. 1, is referred to as a stable region.

The time change in current of the FEG occurs by adsorbing gas residual in the vacuum on the surface of the electron source. When gas particles are adsorbed on the clean metal surface, a work function of the surface increases. As a result, the potential barrier of the surface is enlarged and a number of electrons to be emitted decreases. Since the current of electron beam decreases, a brightness is deteriorated. Also, since an extraction voltage required to obtain the same current increases, an electron having a relatively wide energy spread escapes the potential barrier whereby the energy spread of the electron beam becomes widened. When a predetermined amount of gas particles are adsorbed on the surface, a gas adsorbed layer is formed and thus, a change of the work function decreases and the current becomes relatively stable. A region after the gas adsorbed layer is formed corresponds to the stable region. Even in the stable region, gas is deposited on the adsorbed layer or the adsorbed gas of the surface is substituted with another gas whereby the current gradually keeps decreasing. The gas particles adsorbed on the surface performs desorption, substitution, or migration for a short period of time, which causes noise in current. Also, positive ions generated by the electron beam collide with the electron source, which damages the surface, causing the shape to be uneven, which is also regarded as another cause of noise.

The clean metal surface may be obtained again by performing a flashing operation of heating the electron source for a short period of time. By heating the electron source at a high temperature, the adsorbed gas of the surface is desorbed and metal atoms of the surface migrate, whereby the surface becomes smooth. Through this, the clean surface can be obtained. As a larger amount of gas is adsorbed on the surface, a higher temperature of flashing is required to clean the surface. In the meantime, the surface of the electron source is melted according to the high temperature of flashing and thus, a radius of curvature of a front end increases. When the radius of curvature increases, a strength of an electric field to be applied to the surface decreases and thus, an extraction voltage required for the field emission increases. Substantially, there is an upper limit in an extraction voltage to be applicable and an un-sharpness of diameter of the front end of the electron source by flashing determines a usage lifespan of the electron source.

When a user uses the FEG, the user operates an apparatus based on the time change of current as shown in FIG. 2. The user initially performs flashing 1 of the electron source and then performs increasing 2 of the extraction voltage to thereby emit an electron beam. Since the current significantly decreases in the decreasing region immediately after the emission, the user avoids a use of this region and uses the stable region after waiting for tens of minutes until the current enters a stable region where the decrease in current is gradual. Since the current slowly decreases even during the period of the stable region, the user maintains the current to be greater than a predetermined value by repeating increasing 2 of the extraction voltage. Every time the extraction voltage is increased, a criterion of an electron optical system changes and thus, the user may need to re-coordinate an optical axis. Also, when an observation continues for several hours, noise starts occurring in the current. The noise disturbs the usage of the FEG. The noise is eliminated by re-flashing the electron source and thereby cleaning the surface. In the case of flashing, the time change of current is returned to an initial state and thus, the user resumes the use after waiting until the current enters the stable region.

In general, when performing flashing, the user performs stop 3 of the extraction voltage and stops emitting of the electron beam once. This is because when flashing is performed in a state where the extraction voltage is applied, a protrusion of an atom level is formed on the front end of the electron source. The phenomenon where the protrusion is formed is referred to as buildup. The buildup occurs when metal atoms of the surface melted at a high temperature in flashing are drawn towards the front end by the electric field and deposited thereon. Due to the protrusion, a strength of the electric field concentrated on the front end increases and emission current increases. However, due to the protrusion, the adsorbed gas or damage effect is serious and the current easily becomes unstable. Due to the above reasons, the buildup is avoided for practical use.

As described above, even though the FEG has a high resolving power compared to other electron guns, it is inconvenient to use the FEG in that the time change of current occurs. Also, the time change of current becomes an issue with respect to an apparatus requiring a long period of stable current such as an analysis SEM, a length measurement SEM. Accordingly, it is difficult to apply the FEG. Currently, in many cases, Schottky emission electron gun having a relatively low resolving power, however, having stable current is installed in the above apparatuses.

As a method of automatically keeping maintaining the current of FEG to be greater than a predetermined magnitude, a method of intermittently performing flashing in the stable region, disclosed in patent document 1, or a method of intermittently performing flashing in the decreasing region, disclosed in patent document 2, are known. In the meantime, as a method of extending the time change of current to thereby reduce a decreasing speed, a method of enhancing a vacuum degree around the electron source using a titan sublimation pump and liquid nitrogen cooling is disclosed in non-patent document 1. Also, as an electron gun structure of enhancing the vacuum degree, a charged particle beam apparatus using a non-evaporative getter (NEG) pump is disclosed in patent document 3, and a charged particle beam apparatus including an NEG pump and an ion pump is disclosed in patent document 4. In addition, as a structure of supplying gas to an electron gun, patent document 5 is proposed.

PRIOR ART DOCUMENTS

Patent Documents

Patent Document 1: U.S. Pat. No. 3,786,268
Patent Document 2: Japanese Patent Application Laid-Open Publication No. 2007-73521
Patent Document 3: Japanese Unexamined Patent Application Publication No. Hei3(1991)-505386
Patent Document 4: Japanese Patent Application Laid-Open Publication No. 2006-294481
Patent Document 5: Japanese Patent Application Laid-Open Publication No. 2007-172862

Non-Patent Document

Non-Patent Document 1: B. Cho, Applied Physics Letters, volume 91, (2007) P012105

DISCLOSURE OF THE INVENTION

Problem to be Solved by the Invention

As described above, since emission current of a field emission electron gun (FEG) decreases over time and noise occurs, the FEG is unstable. As for one of problems, since current decreases immediately after emission, an electron beam having a high brightness and a narrow energy spread of an initial emission cannot be stably and continuously used. By using the method of enhancing the vacuum degree around the electron source disclosed in non-patent document 1, it is possible to extend the time change and to delay the decreasing speed of current. However, even though the vacuum degree is enhanced, the decreasing speed in the decreasing region is comparatively high and thus, the current continuously decreases at all times. It is difficult to use an electron beam of this region for the apparatus.

In addition, as another problem, even in the case of the stable region used in the related art, the current may slowly keep decreasing. Due to the above, increasing of the extraction voltage and an axis coordination according to the increasing need to be performed once per tens of minutes. Also, since noise occurs in current over several hours, flashing may be required by stopping the use. Also, to use the stable region, a waiting time of at least tens of minutes is required. The method of continuously providing the stable region by intermittent flashing, disclosed in patent document 1, needs to maintain a state where a predetermined amount of gas is adsorbed on the surface of the electron source. For this, it is difficult to control a flashing strength. Since the current decrease in the decreasing region is outstanding, the method of performing intermittent flashing in the decreasing region needs to perform flashing frequently at short time intervals in order to maintain the current to be greater than a predetermined value. Frequent flashing makes the front end of the electron source dull and shortens a lifespan of the electron source. Also, every time flashing is performed, there is a need to stop emitting of the electron beam once. In the case of the method of performing flashing while irradiating the electron beam, disclosed in patent document 2, the current becomes unstable due to the protrusion formed on the front end of the electron source by the buildup. Also, a thermal electron is generated from a high temperature of electron source during flashing and noise of the electron beam occurs, which disturbs the usage. The method of enhancing the vacuum degree around the electron source and extending the time change may smooth a decrease of current in the stable region and delay a time when noise starts occurring. However, in that the decreasing region is also extended, a waiting time is prolonged in terms of use.

It is an object of the present invention to provide a charged particle beam apparatus that may stably obtain an electron beam having a high brightness and a narrow energy spread.

It is another object of the present invention to provide a charged particle beam apparatus that may quickly obtain a stable electron beam where a decreasing speed is reduced during a long term and noise is little.

Means for Solving the Problems

The object may be achieved by configuring a charged particle beam apparatus of the present invention including a field emission electron source and an electrode to apply an electric field to the field emission electron source, by including a vacuum exhaust unit to maintain a pressure around the field emission electron source to be less than $1 \times 10^{-8}$ P, by using wherein an electron beam having a central radiation angle within $1 \times 10^{-2}$ sr among electron beams emitted from the field emission electron source, and by maintaining a second order differentiation about a time of current of the electron beam to be minus or 0 for at least one hour after flashing of the field emission electron source. More preferably, the current of the electron beam having a decreasing rate 10% or less per hour is used.

Also, the object may be achieved by including, in the charged particle beam apparatus, a heating unit of the field emission electron source, and a detector of current of the electron beam emitted from the field emission electron source, and by maintaining the current of the electron beam emitted from the field emission electron source to be greater than a predetermined value by repeatedly heating the field emission electron source using the heating unit.

Further, the above object may be achieved by including a heating unit for the field emission electron source, and by emitting electron beams from the field emission electron source while normally keeping heating the field emission electron source in 1500 degrees or less.

In addition, the object may be achieved by configuring a charged particle beam apparatus including a field emission electron source, an electrode to apply an electric field to the field emission electron source, by including a vacuum exhaust unit exhausting around the field emission electron source and a gas adsorbed layer forming unit to form a gas adsorbed layer on the surface of the field emission electron source, and by controlling a change in current of an electron beam emitted from the field emission electron source using the vacuum exhaust unit and the gas adsorbed layer forming unit. More preferably, the vacuum exhaust unit of the charged particle beam apparatus maintains a pressure around the field emission electron source to be less than $1 \times 10^{-8}$ Pa.

Effects of the Invention

According to the present invention, there may be provided a charged particle beam apparatus of providing a highly stable electron beam, and a method of controlling the same.

BRIEF DESCRIPTION OF THE DRAWINGS

FIG. 17 is a diagram illustrating a time change when performing flashing while supplying hydrogen gas in a third embodiment.

BEST MODES FOR CARRYING OUT THE INVENTION

Hereinafter, the best mode for carrying out the present invention will be described by referring to the accompanying drawings. In addition, in the description of the present specification, "means" is also referred to as "unit" or "device", for example, a heating means as a heating unit and the like.

First Embodiment

Figure 3:
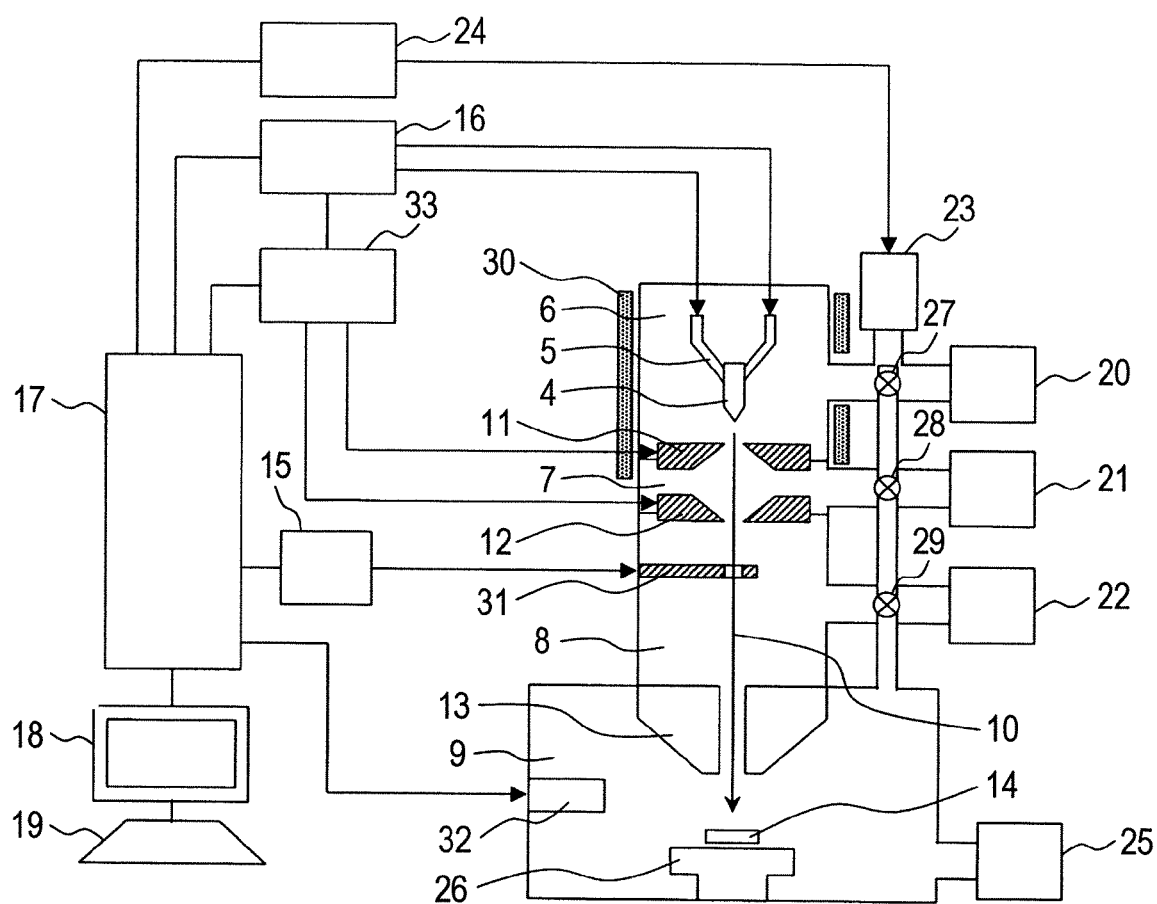
FIG. 3 is a configuration diagram of a scanning electron microscope (SEM) according to a first embodiment.

The present embodiment describes a charged particle beam apparatus that may stably obtain an electron beam having a high brightness immediately after emission of current and having a narrow energy spread. FIG. 3 illustrates a scanning electron microscope (SEM) as a first embodiment of the charged particle beam apparatus. An electron source 4 uses a sharpened front end of a single crystal tungsten beam of <310> azimuth. The electron source 4 is fixed to a front end of a tungsten filament 5 and is installed within an electron gun chamber 6. The electron gun chamber 6 performs exhaust by an ion pump 20 and a non-evaporative getter (NEG) pump 23, and is maintained to be less than $1 \times 10^{-8}$ Pa, particularly, less than $1 \times 10^{-9}$ Pa. The NEG pump has advantages in that it is small, light, and inexpensive compared to other vacuum exhaust methods such as a method of cooling a titan sublimation pump or apparatus using liquid nitrogen. Even though the NEG pump 23 is heated by a NEG heating unit 24 once and thereby reaches a room temperature, the NEG pump 23 continues the exhaust. The electron gun chamber 6 is connected to a first intermediate chamber 7 via an aperture on a center between extraction electrodes 11. Also, the first intermediate chamber 7 is connected to a second intermediate chamber 8 via an aperture between acceleration electrodes 12. An upper structure above the second intermediate chamber 8 is generally used as an FEG. The second intermediate chamber 8 is connected to a sample chamber 9 via an aperture between objective lenses 13. The first intermediate chamber 7 performs the exhaust by an ion pump 21, the second intermediate chamber 8 performs exhaust by an ion pump 22, and the sample chamber 9 performs exhaust by a turbo molecular pump 25, whereby a differential exhaust structure is achieved.

After flashing the electron source 4 using a flashing power source 16 until an adsorbed layer disappears on the surface, an extraction voltage is applied between the electron source 4 and the extraction electrode 11 using a high voltage power source 33, and an electron beam 10 is emitted from the electron source 4. The electron beam 10 is accelerated by an acceleration voltage applied between the electron source 4 and the acceleration electrode 12 using the high voltage power source 33, and reaches the second intermediate chamber 8. By passing the electron beam through an aperture installed in the aperture electrode 31 and thereby eliminate an outer circumferential part, an emission angle of an electron beam to be used is determined. By connecting a current detector 15 to the aperture electrode 31, a change in emission current is monitored. Monitoring of emission current may be performed by detecting, using the current detector 15, all the current emitted from the electron source 4. Next, the electron beam 10 is focused by the objective lens 13 and irradiated towards a sample 14 disposed on a sample stage 26. Electrons emitted from the sample 14 are detected by an emission electron detector 32 and processed by a controller 17, whereby an observed image is obtained.

Flashing is performed by flowing current into the tungsten filament 5 for a predetermined time and by increasing the temperature of the electron source 4 through current carrying heat. A time for applying current is maximally a few seconds and applying of the current is performed several times based on a state of the surface. Prior to using the apparatus or in the case of maintenance performed once every few months, a baking operation by heating, using an electron gun heating unit 30, the electron gun chamber 6 is performed. Through baking, gas emitted from walls of the electron gun chamber 6 is exhausted and the electron gun chamber 6 may be maintained at the pressure less than $1\times10^{-8}$ Pa in a normal state. Baking is performed even with respect to the first intermediate chamber 7 and the second intermediate chamber 8. Since the pressure of the electron gun chamber 6 increases while baking, a rough exhaust valve 27, a rough exhaust valve 28, and a rough exhaust valve 29 are opened and exhaust gas by using the ion pump 21, the ion pump 22, and the turbo molecular pump 25 in combination. As described above, the NEG pump 23 starts exhausting gas by heating with the NEG heating unit 24. However, by heating of the NEG pump 23 while baking, it is possible to effectively exhaust gas temporarily emitted from the NEG pump 23 when the temperature reaches a high temperature, and to prevent the emitted gas from being adsorbed on walls of the electron gun chamber 6.

Figure 1:
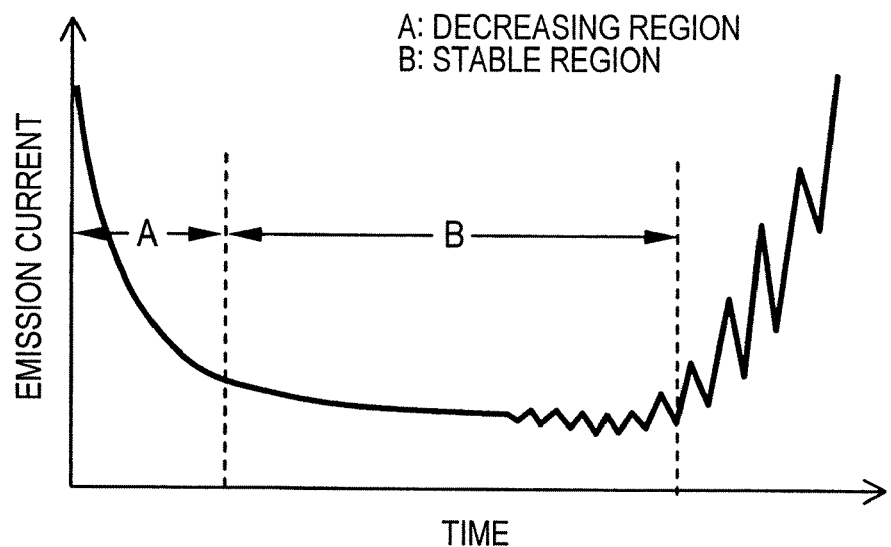
FIG. 1 is a diagram illustrating a time change of emission current of a field emission electron gun (FEG) in the related art.
Figure 2:
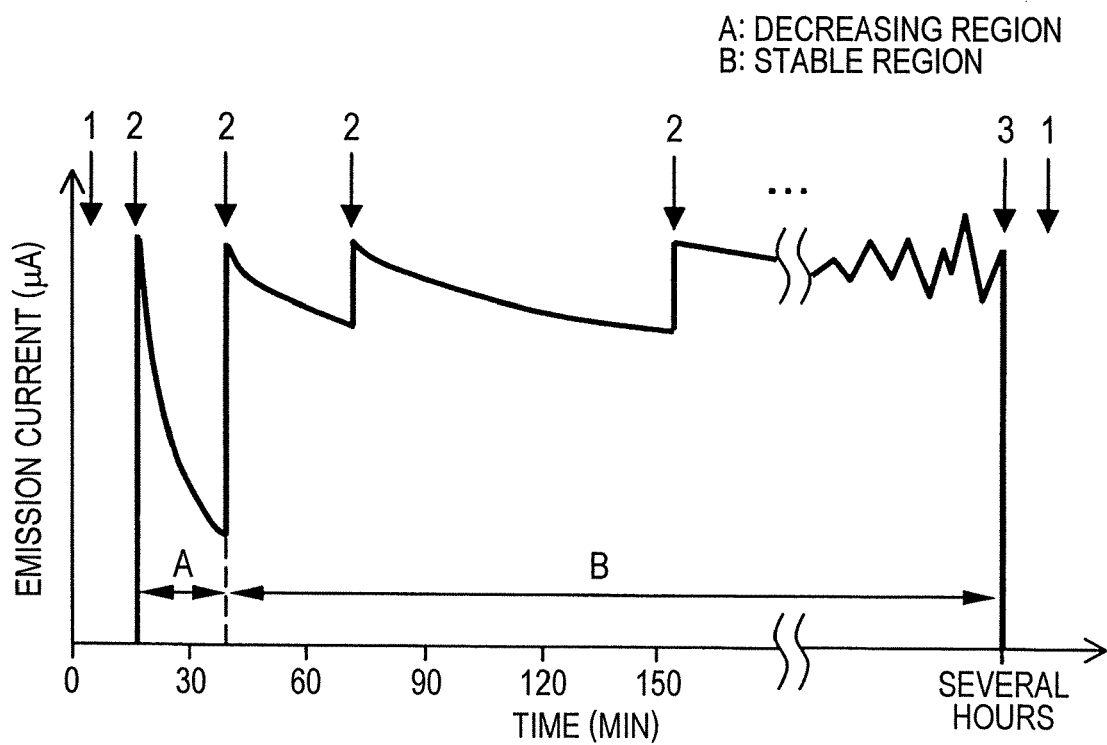
FIG. 2 is a diagram to describe a change in emission current when using the FEG in the related art.

In the case of an observation, the electron source 4 is flashed until the gas adsorbed layer disappears on the surface and then, the extraction voltage is applied and the electron beam 10 is irradiated. The current of an emission angle less than $1\times10^{-2}$sr emitted from a center of the front end of the electron source 4 in the electron beam 10 is squeezed by the aperture electrode 31 and is used as probe current. By maintaining the pressure around the electron source to be less than $1\times10^{-8}$ Pa, the probe current changes, which is different from the conventional time change of FIG. 1, shown in FIG. 4.

Figure 4:
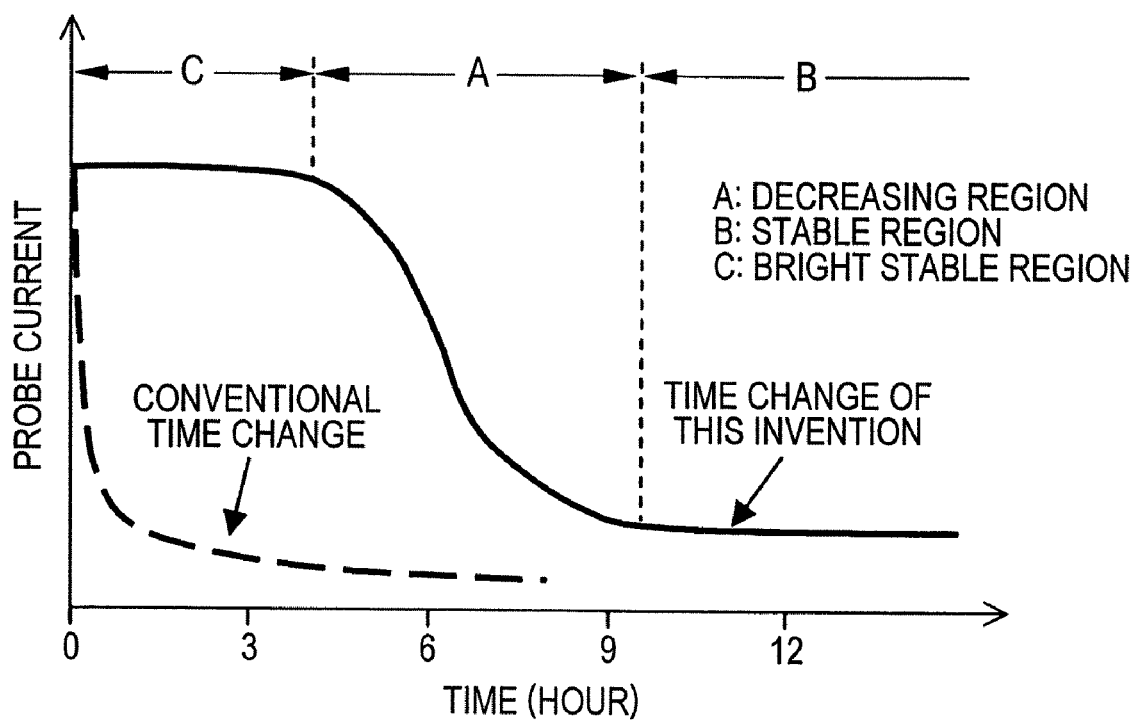
FIG. 4 is a diagram to describe a time change of emission current obtainable from the first embodiment.

In the present embodiment, an observation uses a region where a current immediately after emission gradually decreases while maintaining an upwardly convexed high current, as indicated by C in FIG. 4, i.e., a region where a second order differentiation about time of current is minus or 0, and a decreasing rate is less than 10% per hour. The continuity time of this region depends on a vacuum degree around the electron source and lies in a zone of $10^{-9}$ to $10^{-10}$ Pa, which corresponds to at least one hour, i.e., from several hours to tens of hours. Hereinafter, this current region is referred to as a "bright stable region". The bright stable region corresponds to a new current region that has not been known so far. By maintaining the vacuum pressure around the electron source to be less than $1\times10^{-8}$ Pa as in the present embodiment, and by using the local current of the electron-beam-center, the bright stable region finally appears and can be used.

As described above with reference to FIG. 1, in the general time change of emission current, the current significantly decreases by adsorbing gas on the surface of the electron source. The decreasing speed of current is greatest immediately after starting the emission, and decreases over time. The time change of current is downwardly convexed like a curve shown in the graph of FIG. 1, and a second order differentiation about time of current becomes a plus. As disclosed in non-patent document 1, when enhancing the vacuum degree around the electron source, the decreasing speed of current decreases. However, same as the related art, the graph of the time change of current draws a downwardly convexed curve and a second order differentiation of current is a plus. As described above, when the second order differentiation about time is a plus, the current draws the downwardly convexed curve in the graph and thus, it is not possible to maintain a high current immediately after emission starting.

As described above, by a configuration of enhancing a vacuum degree around an electron source of the present embodiment and by using the local current emitted from a center portion of the clean electron beam surface, it is possible to draw an upwardly convexed curve in the graph and to use a bright stable region of maintaining the high current. The bright stable region may be defined as a region where a time immediately after flashing is at least one hour, a decreasing speed of current is low and a second order differentiation about time of current is minus or 0. The bright stable region had not been reported before and could not be recognized by the conventional vacuum degree.

Figure 5:
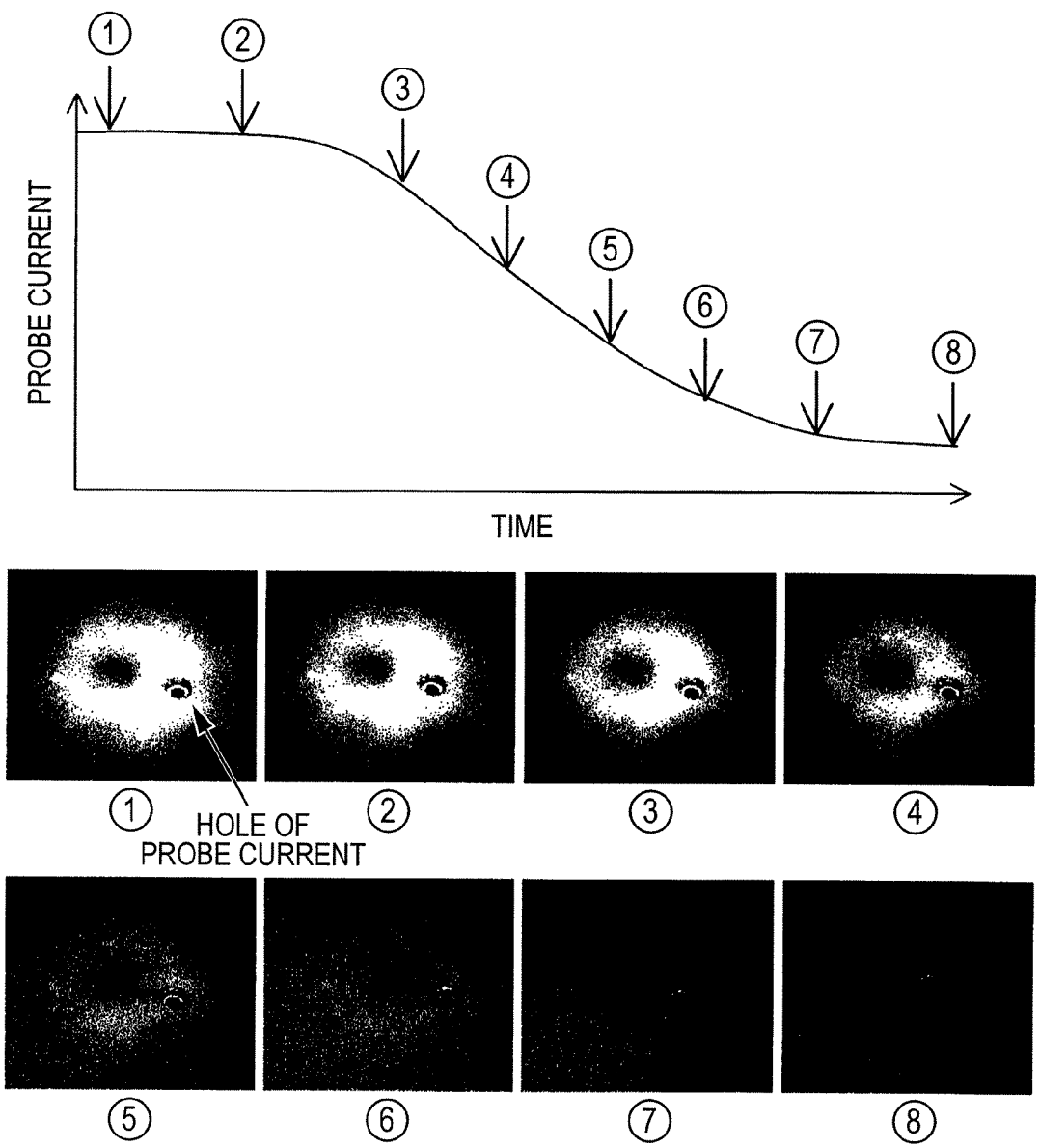
FIG. 5 is a diagram to describe a change in an emission pattern showing a bright stable region of the first embodiment.

An emission pattern in the bright stable region according to the present embodiment will be described with reference to FIG. 5. In an upper portion of FIG. 5, emission pattern obtainment times (circled numbers 1 to 8) in the time change of the same probe current as FIG. 4 are indicated. In a lower portion of FIG. 5, an emission pattern of each obtainment time is indicated. The emission pattern corresponds to an image acquired by lighting an electron emitted from an electron source against a fluorescent screen and an emission part of electron of the electron source surface appears in correspondence to a brightness of the pattern. It can be known from FIG. 5 that the emission pattern becomes dark from an external circumferential part over time (circled numbers 1 to 8) and a center portion maintains a brightness. That is, FIG. 5 shows that the gas adsorption starts from the outer circumferential part of the front end of the electron source, the gas adsorption does not occur in a center part while it is ongoing, and a time difference exists until the adsorption of the center part starts. From the result of the above pattern observation, it is possible to explain that the bright stable region appears in the local current of the center part of the electron beam. The range of the electron beam where the bright stable region appears corresponds to a local electron beam emitted from a region between surface <310> of electron source surface center and intermediate surface <410> of surface <100> that is closest to the surface <310> and to which the electron beam is not emitted. An open angle of both surfaces is 77 mrad from an inner product of a normal vector, and corresponds to an electron beam emitted at a solid angle within about $1\times10^{-2}$sr. When using a local electron beam at a further center part, the continuity time of the bright stable region is extended and it is preferable to use an electron beam of a solid angle within $1\times10^{-3}$sr experimentally.

The electron beam of the bright stable region is emitted from the surface of which a work function of the clean electron source is low, and thus has a high brightness and a narrow energy spread compared to the conventional stable region. In addition, the decreasing speed of current further decreases and noise is also little. Also, since the second order differentiation about time of current is minus, the high current immediately after emission is mostly maintained in a predetermined state for a long period of time. By using the current of this region for an SEM observation, a stable observation having a high resolving power compared to the related art may be performed. Also, since the continuity time of the bright stable region is from several hours to tens of hours, the continuity time is sufficiently long with respect to a one-time use time of the apparatus in a general SEM and the like for scientific analysis. Accordingly, since increasing of the extraction voltage, the axis coordination of the optical system according to the increasing, and re-flashing of the electron source are not required for the one-time observation, there is no need to stop the observation. Also, since a waiting time required to resume the observation in the related art is not required, a user may start the observation immediately after initial flashing. In addition, since the extraction voltage is constant during the observation, the axis coordination of the optical system performed when the acceleration voltage is changed becomes easy. Since a flashing frequency decreases, a lifespan of the electron source is extended.

Figure 6:
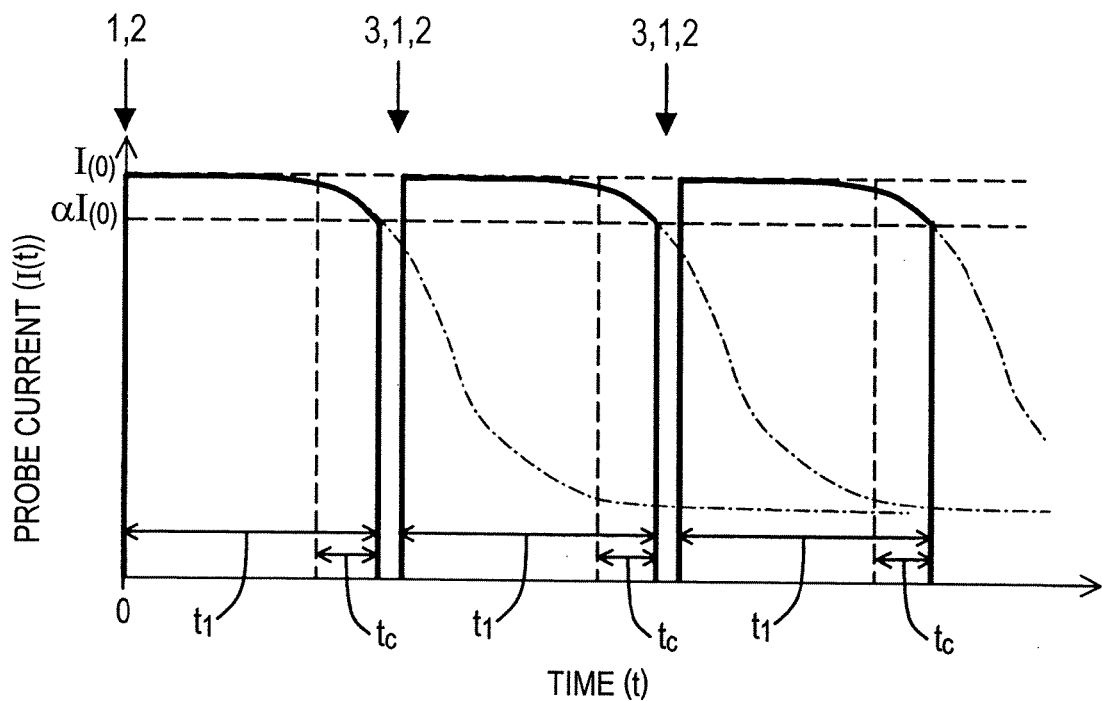
FIG. 6 is a diagram illustrating the time change of emission current when controlling flashing of the first embodiment.
Figure 7:
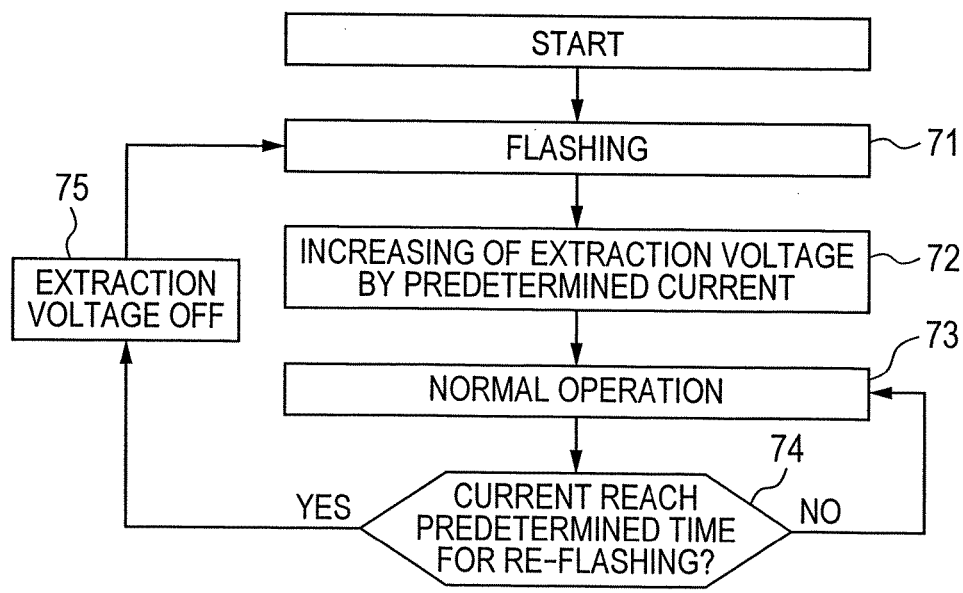
FIG. 7 is a flowchart illustrating an operation when controlling flashing in the first embodiment.

By repeating flashing in the bright stable region, the bright stable region may be consistently used. The time change of current in this case is shown in FIG. 6 and a flowchart of an operation is shown in FIG. 7. In FIGS. 6, 1, 2, and 3 indicate flashing, increasing of the extraction voltage, and stop of the extraction voltage, respectively.

In FIG. 7, when an operation starts by a predetermined manipulation, the extraction voltage increases (72) by predetermined current after flashing (71). Next, a normal operation (73) is performed. Whether the current has reached predetermined timing of re-flashing is determined (74) at predetermined time intervals. When timing of re-flashing is reached, re-flashing is performed by stopping (75) the extraction voltage.

Figure 8:
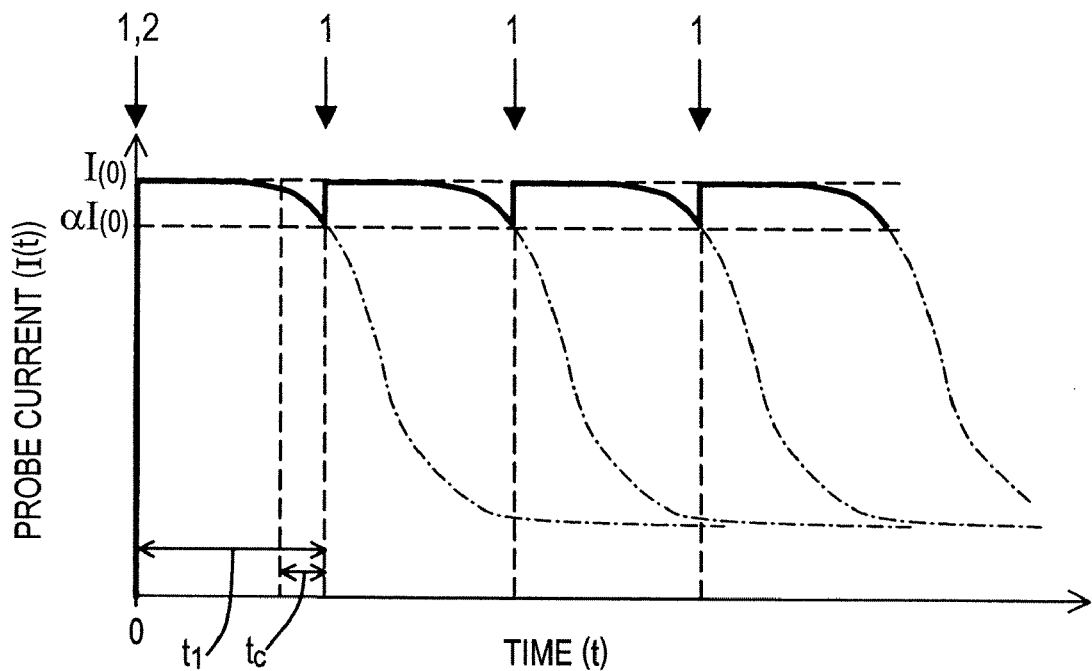
FIG. 8 is a diagram illustrating the time change of emission current when controlling flashing while irradiating the electron beam in the first embodiment.
Figure 9:
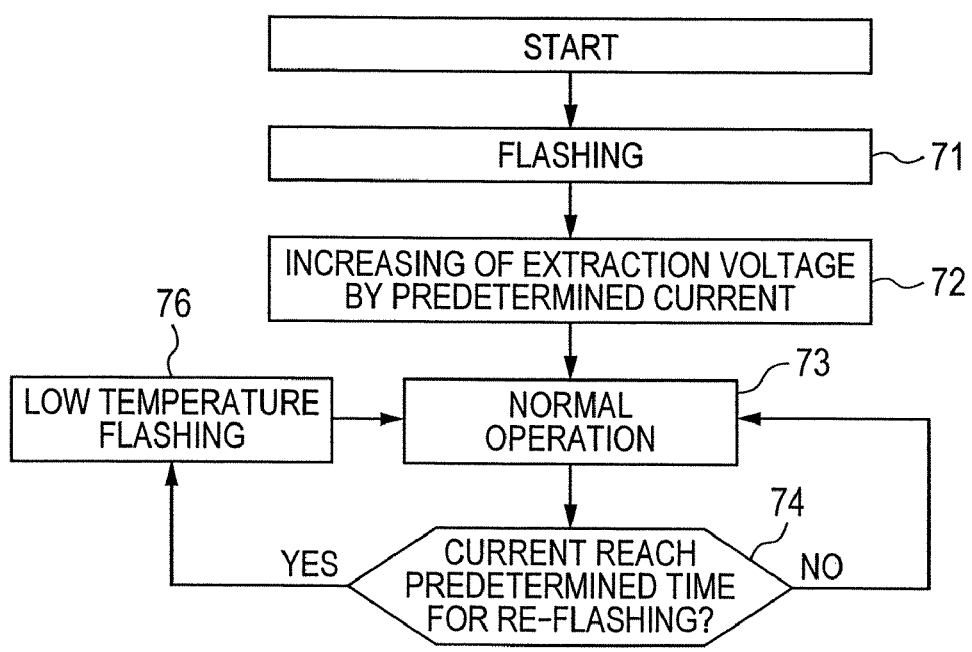
FIG. 9 is a flowchart illustrating an operation when controlling flashing while irradiating the electron beam in the first embodiment.

Also, since an amount of gas adsorbed on the electron source surface is small in the bright stable region, the surface may be cleaned by flashing of a temperature less than 2000 degrees in the related art. In particular, as flashing is performed at the low temperature of less than 1500 degrees, a buildup barely occurs even in a state where the extraction voltage is applied, and an amount of thermal electrons occurs is small. Accordingly, flashing may be performed in a state where the observation is ongoing without stopping irradiation of electron beams. The time change of current in this case is shown in FIG. 8 and a flowchart thereof is shown in FIG. 9. In FIG. 8 and FIG. 9, the same numerical numbers as used in FIG. 6 and FIG. 7 refer to the same objects and the same steps. In FIG. 9, 76 indicates flashing (low temperature flashing) less than 1500 degrees.

When flashing is performed while the observation is ongoing, it is possible to prevent noise occurring in current during flashing from affecting the observation and enhance the user convenience by performing flashing when scanning of an electron beam goes round a sample surface, or by stopping obtaining of the observed image for only a few seconds of flashing.

The aforementioned observation method using flashing may always obtain an electron beam having a high brightness and a narrow energy spread compared to a method of performing flashing in the decreasing region of current disclosed in patent document 2. Also, since the decreasing speed of current is slow and the second order differentiation about time of current is minus, i.e., makes a change expressed as an upwardly convexed graph, it is possible to obtain a stable high current for a long period of time even though a time interval of flashing is extended.

Also, since the low temperature flashing is performed, the buildup barely occurs and an amount of thermal electrons occurring decreases. Since it is difficult to melt the electron source, the lifespan of the electron source is further extended. Since the electron source does not become dull, the extraction voltage may also be used as a predetermined value for a long period of time. Also, since it is possible to use an electron source of another material that cannot be used in 2000 degrees of flashing in the related art, and having a melting point less than tungsten.

The user may perform flashing at random timings by giving an instruction using a manipulator 19 of the apparatus of the present embodiment shown in FIG. 3. Also, the user may select whether to perform flashing after stopping applying of extraction voltage and stopping the observation once, or whether to perform flashing during the observation. The flashing strength may be variably selected, and may be appropriately used depending on an amount of gas adsorbed on the surface of the electron source. By displaying the current monitored by the current detector 15 on a display 18, the user may easily estimate timing of flashing.

Figure 10:
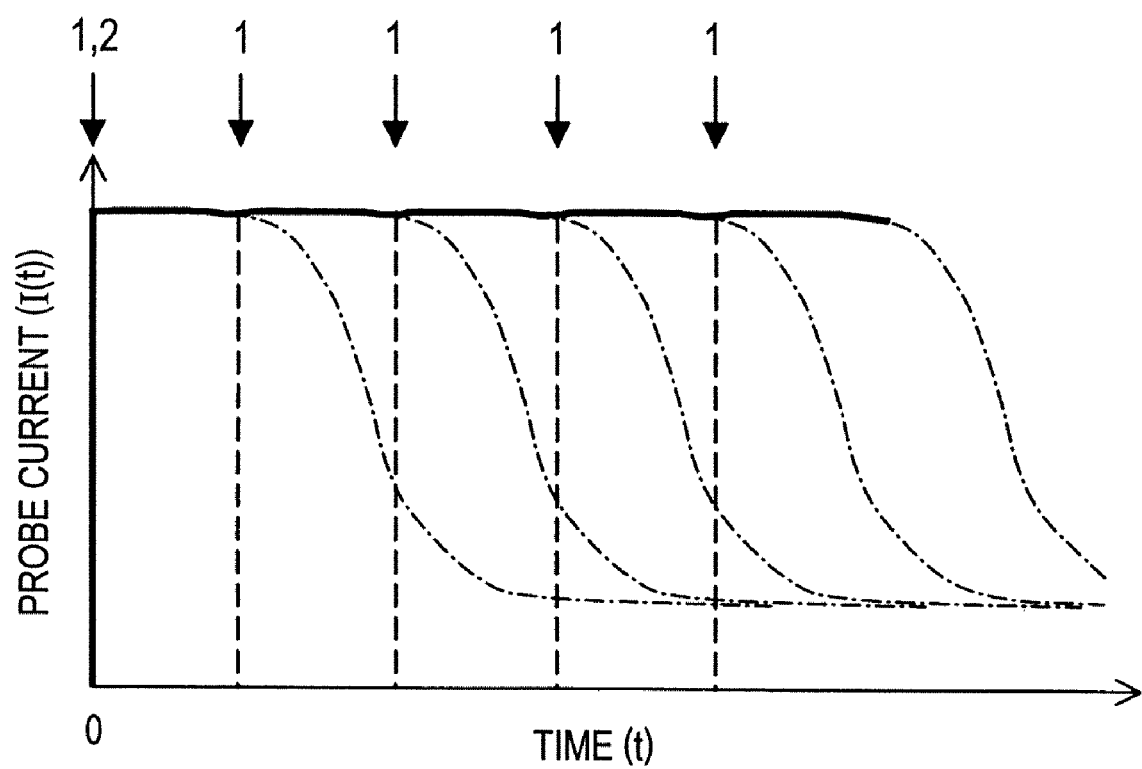
FIG. 10 is a diagram illustrating the time change when controlling flashing at short time intervals in the first embodiment.

Also, the timing of flashing may be automatically determined by a controller 17 and be informed to the user by displaying the timing on the display 18. As one of criteria to determine the timing, as shown in FIG. 6, when current $I_{(t)}$ detected by the current detector 15 becomes to be less than value $\alpha I_{(o)}$ obtained by multiplying emission-immediately-after current $I_{(o)}$ by a predetermined value $\alpha$, flashing is performed. Typically, by using $\alpha$ of 0.8 and more, the user may use the apparatus without recognizing the deterioration in the brightness of the observed image. In particular, when $\alpha$ is greater than 0.95, the variation width of current becomes narrow as shown in FIG. 10, mostly consistent current may be maintained, and the brightness of the observed image is consistent.

As another criterion, as shown in FIG. 6, when a decreasing ratio $[I_{(t)}-I_{(t+tc)}]/I_{(t)}$ of current per time interval $t_c$ becomes to be greater than a predetermined value $\beta$, flashing is performed. In consideration of the time change of current in the bright stable region, when $t_c$ is less than 60 minutes and $\beta$ is greater than 0.01, the change in current may be easily recognized. In particular, when $0.05 \geq \beta \geq 0.01$, the current may be consistently maintained as shown in FIG. 10.

As still another criterion, when a predetermined time $t_1$ is elapsed after flashing, flashing is performed again. Typically, when $t_1$ is greater than 1 hour, a probability of disturbing the observation of the user decreases. In the meantime, when $t_1$ is set to be less than 1 hour, it is possible to consistently maintain the current by decreasing the variation width of current.

Instead of the current value $I_{(t)}$ used for the above determination, the average current value of a predetermined period may be used. In this case, determination may be made regardless of the effect of noise occurring in current. Also, when determining the timing based on the entire current, values such as $\alpha$, $\beta$, and $t_c$, may be slightly different, however, may be determined based on the same criterion.

By using the aforementioned determination criterion and automating flashing using the controller 17, the user's manipulation is not required and the bright stable region is continued. Through this, it is possible to enhance the user convenience. Also, the automation is suitable for an SEM requiring a long term observation such as an analysis SEM, or a critical dimension SEM needing a long term unmanned operation in an inline inspection of a semiconductor manufacturing factory and the like. It is possible to realize the apparatus having a high resolving power by applying the present embodiment.

Also, timings such as when exchanging the sample 14 of FIG. 3, or when significantly moving an observation location of a sample, are added in applying the present embodiment, in addition to the flashing timing. The flashing automation may be selected using the manipulator 19. Also, whether the flashing is being automated is displayed on the display 18. Substantially, it is possible to inform the user by displaying the flashing on the display 18 for a few seconds where flashing is performed.

By repeating flashing in the bright stable region and automatically adjusting, using the controller 17, the extraction voltage according to a slight decrease in current, it is possible to consistently maintain the current. In this case, a voltage may slightly increase and a frequency may be low. Even though the axis coordination of the optical system is required according to the voltage increase, this coordination is also performed by the controller 17.

As another usage method of the present embodiment, the continuity time of the bright stable region is extended by normally keeping heating the electron source 4 by means of the flashing power source 16. This is because a probability that gas is adsorbed on the surface decreases as the temperature of the electron source increases. As the bright stable region continues for a long period of time, increasing of the extraction voltage or frequency of re-flashing decreases. In the case of normal heating, by setting the heating temperature to be less than 1500 degrees, particularly, 100 degrees to 1000 degrees, the buildup or emitting of thermal electron does occur and the stable current may be obtained. Also, when the electron source is heated at 1500 degrees or more, a protrusion is formed on the front end of the electron source due to the buildup. However, since the vacuum degree is enhanced, the change in current may decrease.

Even though tungsten of <310> crystal azimuth is used to the electron source in the present embodiment, the same effect may be achieved even in other crystal azimuths, for example, a low work function of <111> and the like. Also, the same effect may be achieved in the electron source using the same field emission. Other materials such as $LaB_6$, a carbon fiber may be used for the electron source. Also, in addition to the current carrying heating method described in the present embodiment, the flashing method may be replaceable as far as a corresponding method may eliminate gas adsorbed on the surface of the electron source. For example, the flashing method may be performed even in a method of installing, within the electron gun chamber 6, a new filament emitting thermal electrons, and irradiating thermal electrons from this filament towards the electron source 4, or an electric field evaporating method. As another method, the flashing method may be performed in a method of installing a light source such as a laser and irradiating a beam towards the electron source 4, or a method of installing a gas supplier within the electron gun chamber 6 and irradiating rare gas of hydrogen, helium, argon, and the like towards the electron source 4.

According to the aforementioned present embodiment, it is possible to stably obtain an electron beam having a high brightness and a narrow energy spread. By repeating flashing and decreasing the heating temperature, it is possible to continuously use the bright stable region without stopping the observation. It is possible to provide a charged particle beam apparatus that may perform a high resolving power observation for a long period of time by using the electron beam.

Second Embodiment

Hereinafter, a second embodiment will be described with reference to FIG. 11 to FIG. 16. The present embodiment describes a charged particle beam apparatus of including a gas adsorbed layer forming unit and decreasing a time of a decreasing region to thereby obtain the stable current of a stable region compared to a related art.

Figure 11:
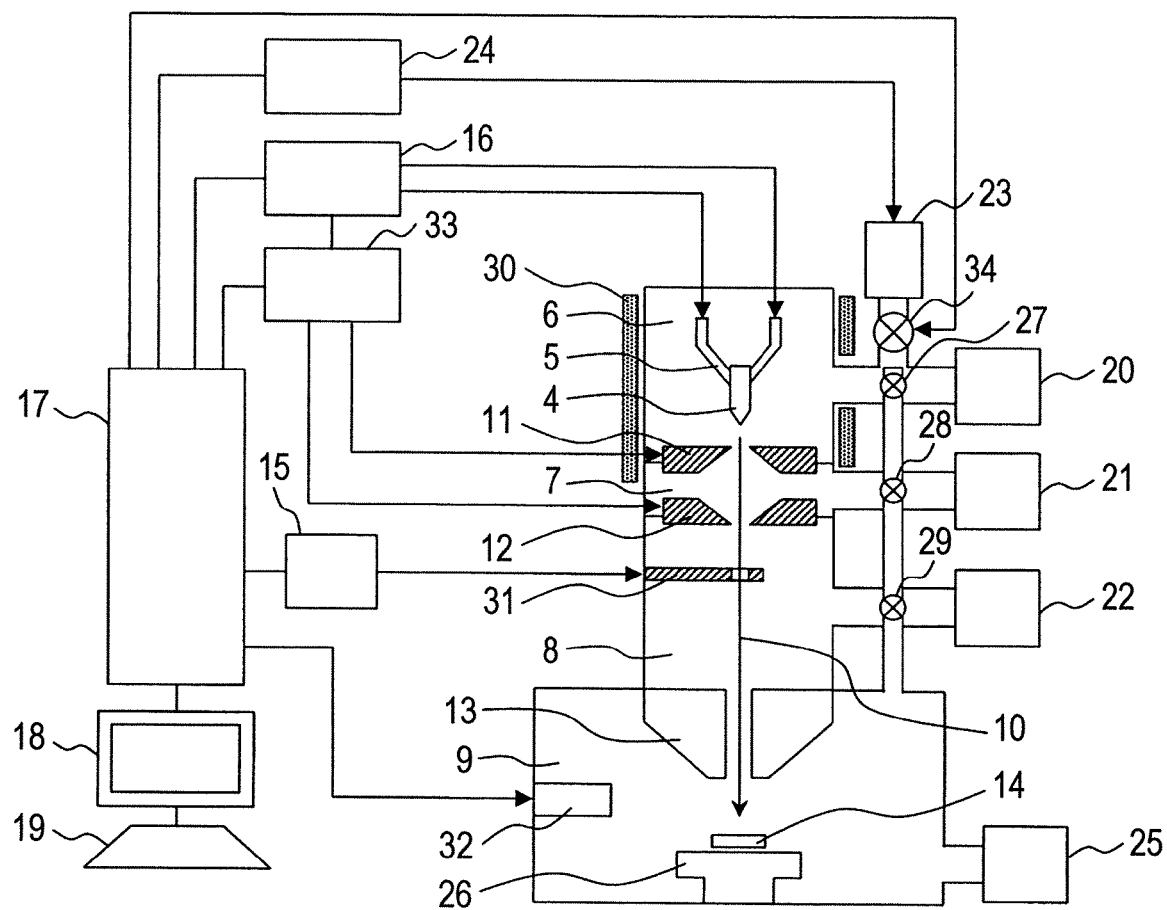
FIG. 11 is a configuration diagram of an SEM including a non-evaporative getter (NEG) pump valve according to a second embodiment.
Figure 12:
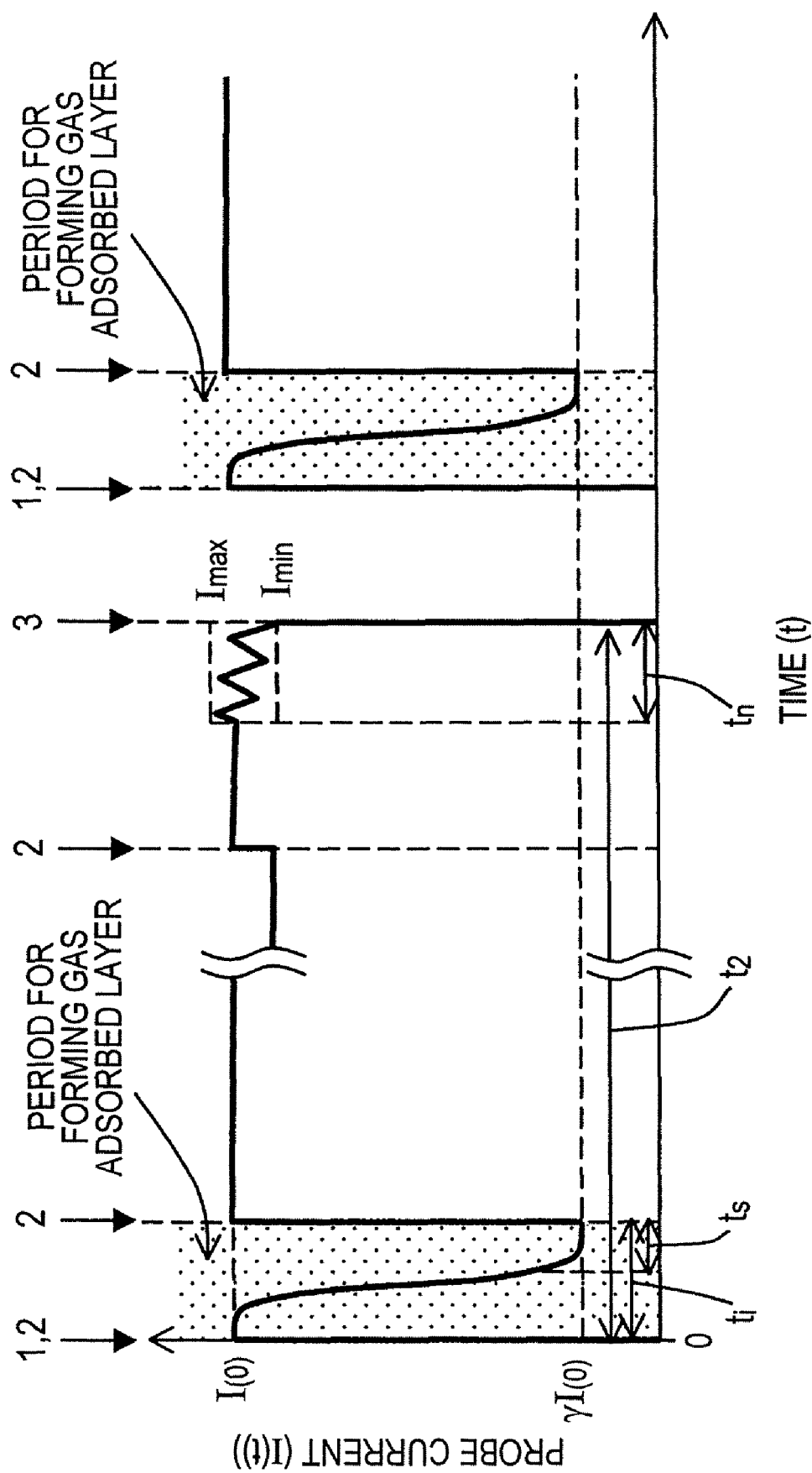
FIG. 12 is a diagram illustrating a time change of emission current when controlling forming of a gas adsorbed layer in the second embodiment.
Figure 13:
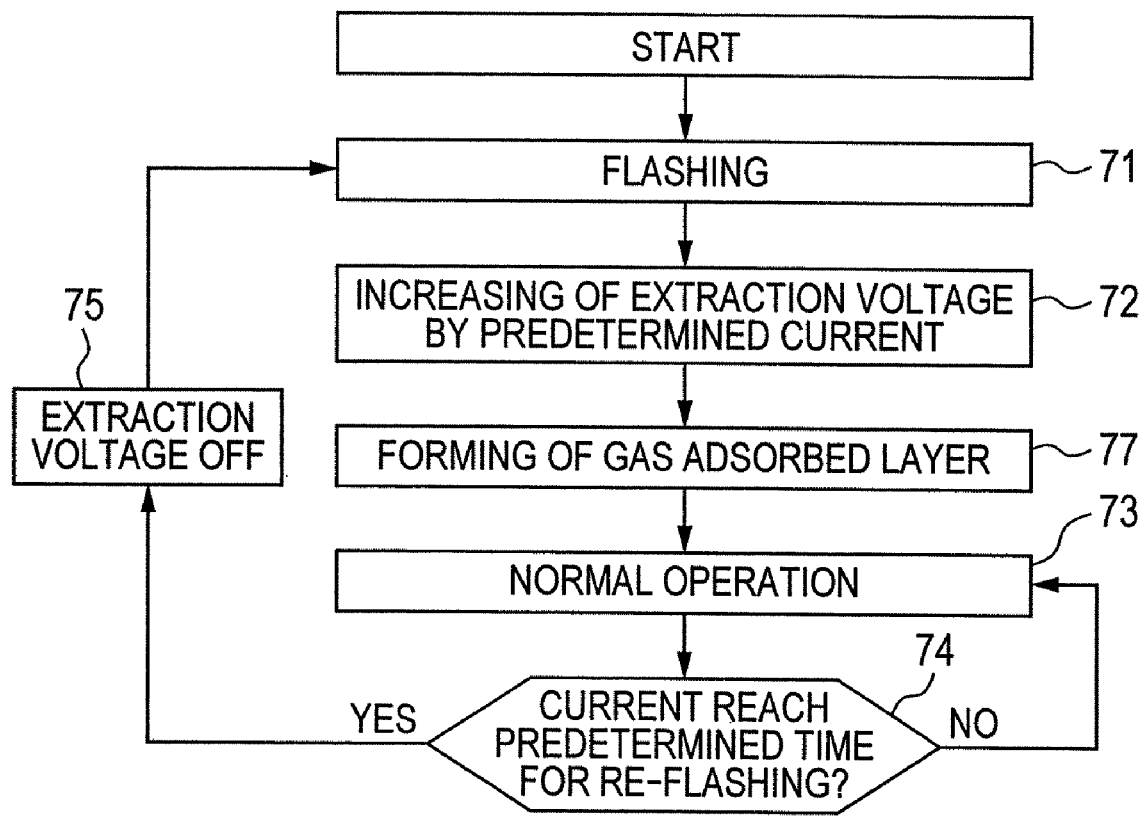
FIG. 13 is a flowchart illustrating an operation when controlling forming of the gas adsorbed layer in the second embodiment.

FIG. 11 illustrates the entire configuration of an SEM that is the charged particle beam apparatus according to the second embodiment. The time change of emission current in the present embodiment is shown in FIG. 12, and a flowchart of an operation is shown in FIG. 13. In FIG. 13, 77 indicates a process of forming a gas adsorbed layer and the same numbers as used in FIG. 7 indicate the same process.

The configuration of the apparatus is mostly the same as the first embodiment, however, has a configuration of connecting the NEG pump 23 to the electron gun chamber 6 by an NEG pump valve 34 disposed as a gas adsorbed layer forming unit. In the present embodiment, the electron source 4 is flashed using the flashing power source 16 until the gas adsorbed layer disappears on the surface and then the electron beam 10 is irradiated by applying the extraction voltage to the extraction electrode 11 using the high voltage power source 33. Only during a period of the decreasing region immediately after emission, only a half of the NEG pump valve 34 is opened or is closed using the controller 17 to thereby decrease the exhaust speed of the NEG pump 23 and to temporarily increase the vacuum pressure of the electron gun chamber 6. At the same time, it is possible to accelerate the gas adsorption by decreasing the exhaust speed of the ion pump 20. The pressure of the electron gun chamber in this case is typically from $1 \times 10^{-8}$ to $1 \times 10^4$ Pa, more preferably, from $1 \times 10^{-7}$ Pa to $1 \times 10^{-5}$ Pa. Due to the pressure increase, the gas adsorbed layer is formed on the surface of the electron source for a short period of time and the current enters the stable region. Next, the NEG pump valve 34 is opened and the pressure of the electron gun chamber 6 is maintained again to be less than $1 \times 10^{-8}$ Pa, particularly, $1 \times 10^{-9}$ Pa. After making the current reach a predetermined magnitude by increasing again the extraction voltage, the observation in the stable region is performed. When noise in current increases, irradiating of the electron beam is stopped and then flashing is performed. After flashing, irradiating of the electron beam and forming of the gas adsorbed layer is again performed and the current of the stable region is again obtained.

According to the present embodiment, it is possible to use the current of the stable region at a short waiting time. Also, since the vacuum pressure around the electron source is low in the stable region compared to the related art, it is possible to obtain the current of the stable region of which the decreasing speed further decreases, of which noise is low, and of which the continuity time is long. The continuity time of the stable region is approximately from tens of hours to hundreds of hours in $10^{-9}$ to $10^{-10}$ Pa and is longer than several hours in the related art. Since the decreasing speed decreases, the high current is maintained for a long period of time and an opportunity of increasing the extraction voltage decreases. Also, since a period where noise occurs in current is extended, a flashing frequency decreases. As described above, a number of manipulations required for stopping the observation decreases and thus, the user convenience is enhanced. Also, a decrease in the flashing frequency extends the lifespan of the electron source.

The user may perform flashing at random timings and forming of the gas adsorbed layer by giving an instruction using the manipulator 19. When a period of gas adsorption is extended, gas is excessively adsorbed on the surface of the electron source. Thus, the controller 17 determine a timing for terminating the gas adsorption and the determined timing may be informed to the user by displaying the determined timing on the display 18. Also, the user may select whether to automatically form the gas adsorbed layer using the controller 17. In the case of the automation, the gas adsorption starts immediately after flashing and is terminated at the timing determined by the controller 17.

As a criterion of the timing for terminating the gas adsorption, the gas adsorption is terminated when current $I_{(t)}$ detected by the current detector 15 becomes to be less than value $\gamma I_{(o)}$ obtained by multiplying the current $I_{(o)}$ immediately after emission by a predetermined value $\gamma$. Typically, by using $\gamma$ of less than 0.2, it is possible to obtain the current having a low decreasing speed. In particular, by using $\gamma$ of less than 0.1, it is possible to obtain the current having a further low decreasing speed.

As another criterion, as shown in FIG. 12, when a decreasing ratio $[I_{(t)}-I_{(t+ts)}]/I_{(t)}$ of current per time interval $t_s$ becomes to be less than a predetermined value $\epsilon$, the gas adsorption is terminated. Typically, when $t_s$ is less than 5 minutes, evaluation is easy and in this case, $\epsilon$ may be less than 0.05.

Figure 14:
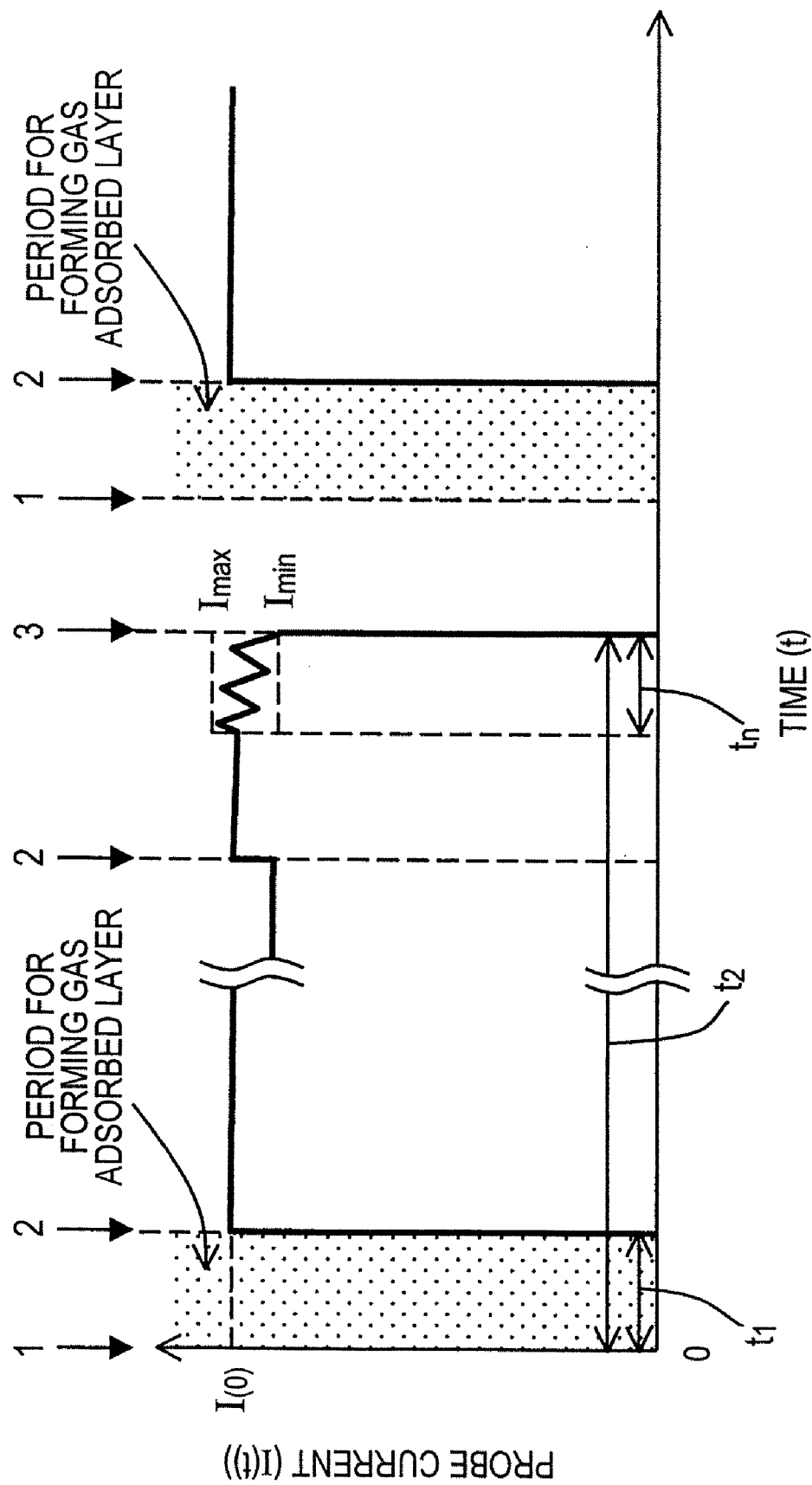
FIG. 14 is a diagram illustrating the time change of emission current when controlling forming of the gas adsorbed layer without irradiating the electron beam in the second embodiment.

As still another criterion, when a predetermined time $t_i$ is elapsed after starting the gas absorption, the gas absorption is terminated. Typically, when $t_i$ is less than ten minutes, the gas adsorbed layer is formed on the surface. In addition, the above method may be applied without irradiating the electron beam. In this case, the time change of current appears as shown in FIG. 14, and forming of the gas adsorbed layer is terminated. After the pressure of the electron gun chamber 6 becomes to be less than $1 \times 10^{-8}$ Pa, emitting of the electron beam 10 starts.

When a predetermined time is elapsed after entering the stable region, noise starts occurring in the current. In this case, there is a need to clean the surface of the electron source by re-flashing. Even though flashing may be performed by the user at random timings similar to the first embodiment, the timing may be determined by the controller 17 and the determined timing may be informed to the user by displaying the determined timing on the display 18. Also, flashing automation using the controller 17 may be selected by the manipulator 19.

As one criterion for determining the timing, with respect to the current per time $t_n$ of FIG. 12, when a change ratio $(I_{max}-I_{min})/[(I_{max}+I_{min})/2]$ obtained by dividing a difference $(I_{max}-I_{min})$ between a maximum value $I_{max}$ of current and a minimum value $I_{min}$ of current by the average becomes to be greater than a predetermined value $\xi$, the timing is determined. As a criterion of when the observed image does not become worse, a criterion where $t_n$ is less than 5 minutes and $\zeta$ is less than 0.1 is typically used.

As another criterion, it corresponds to a case where a time $t_2$ is elapsed after flashing. In consideration of the continuity time of the stable region, $t_2$ is typically several days and more.

The timing for terminating the gas absorption and the flashing timing may be determined using all the current. Even though values such as $\gamma$, $\epsilon$, $t_s$, $t_i$, etc., may slightly vary, the determination may be performed alike.

Since the controller 17 automatically performs forming of the gas adsorbed layer and re-flashing, the user's manipulation is not required and it is possible to continuously use only the stable region based on several days or several months.

Also, it is possible to consistently maintain the current by automatically adjusting the extraction voltage using the controller 17 according to a slight decrease in current. In this case, a voltage may slightly increase and a frequency may be low. Even though the axis coordination of the optical system is required according to the voltage increase, this coordination is also performed by the controller 17. It is possible to enhance the user convenience according to the automation. Also, an FEG may be applicable to an SEM requiring a long term observation such as an analysis SEM, or a length measurement SEM used for an inline inspection of a semiconductor manufacturing factory and the like. Accordingly, it is possible to achieve an apparatus having a high resolution compared to the related art.

In addition to the above, a timing for exchanging a sample, a regular maintenance of the SEM, and the like are added to the timing for applied re-flashing and performing the gas absorption. Whether the automation is currently ongoing is displayed on the display 18 and thereby is informed to the user. Also, while substantially performing flashing or gas absorption, it is displayed on the display 18.

Figure 15:
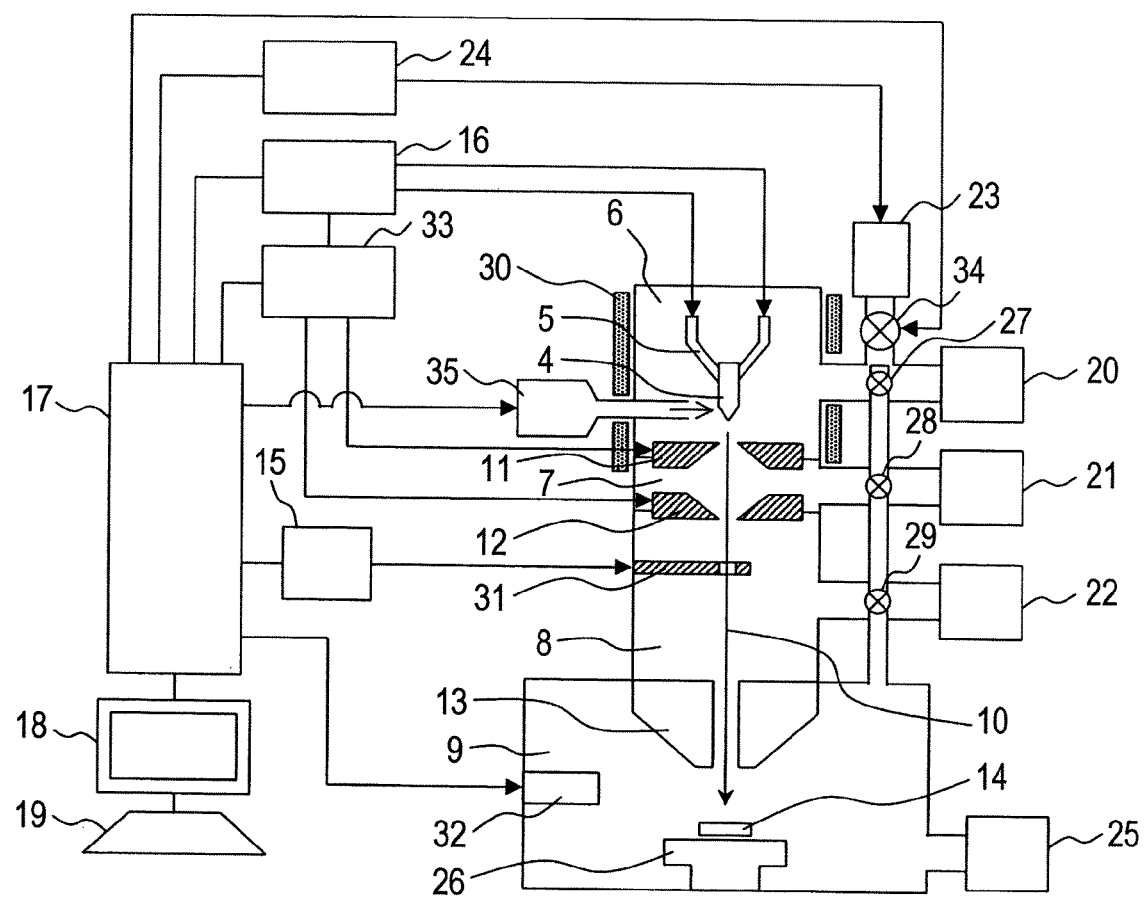
FIG. 15 is a diagram illustrating the entire configuration of an apparatus including a gas supplier of the second embodiment.

In the present embodiment, the current of the stable region is obtained for a relatively short waiting time by decreasing the exhaust speed of the vacuum exhaust unit and by forming the gas adsorbed layer on the surface of the electron source during the period for the decreasing region. As shown in FIG. 15, it is possible to accelerate forming of the gas adsorbed layer by installing the gas supplier 35 in the electron gun chamber 6 and spraying gas towards the surface of the electron source.

The gas supplier 35 is used as follows. The electron source 4 is cleaned by flashing and then, the electron beam 10 is irradiated. Gas such as hydrogen, oxygen, carbon dioxide, or methane, etc., is supplied from the gas supplier 35 towards the electron source 4 and is adsorbed on the surface. A gas supply method includes a method of continuously supplying a predetermined amount of gas and a method of intermittently supplying gas. By decreasing the exhaust speed of the NEG pump 23 or the ion pump 20 at the same time with the gas supply, it is possible to accelerate adsorbing of the gas. In the meantime, without decreasing the exhaust speed, it is possible to selectively form, as the gas adsorbed layer on the surface of the electron source, the gas supplied from the gas supplier 35. By supplying of the gas, the gas adsorbed layer is formed on the surface of the electron source 4 and the current quickly decreases and thereby the current enters the stable region. Next, supplying of the gas is stopped and the electron gun chamber is maintained to be less than $1 \times 10^{-8}$ Pa, particularly, $1 \times 10^{-9}$ Pa. After increasing emission current by performing increasing 2 of the extraction voltage, the observation in the stable region is performed. When noise starts occurring in the current, applying of the extraction voltage is stopped and irradiation of the electron beam is stopped and then flashing is performed. After flashing, irradiation of the electron beam and forming of the gas adsorbed layer are again performed and then, the current of the stable region is again obtained.

A period and timing for supplying the gas is the same as the aforementioned period and timing for forming the gas adsorbed layer and the automation may be performed using the controller 17 according to flashing. Also, the user may discharge a predetermined amount of gas at random timings using the manipulator 19.

Figure 16:
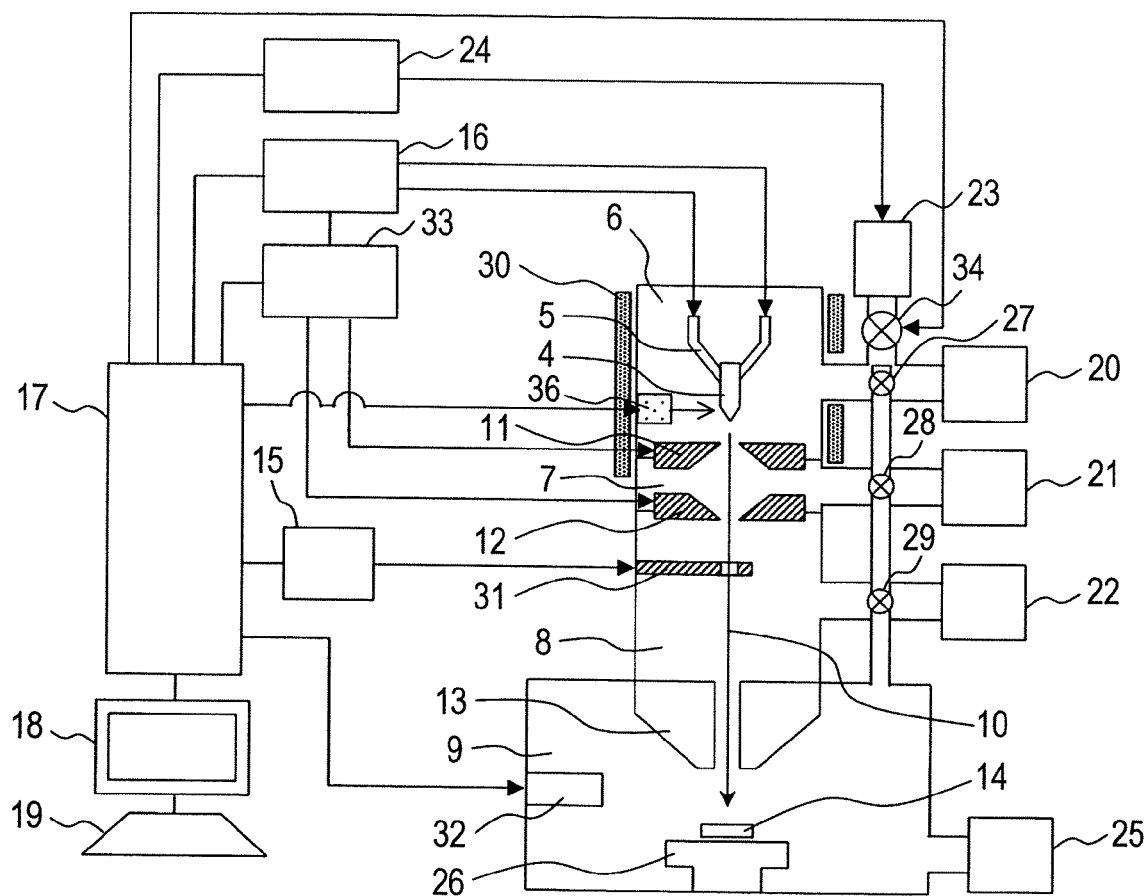
FIG. 16 is a diagram illustrating the entire configuration of an apparatus including a gas adsorbing material of the second embodiment.

As another example of a means of spraying gas towards the other electron source, as shown in FIG. 16, there is a method that may accelerate forming of the gas adsorbed layer by installing a gas adsorbing material 36 in the electron gun chamber 6 and spraying gas towards the surface of the electron source.

Like the gas supplier 35, the gas adsorbing material 36 is used to accelerate forming of the gas adsorbed layer by discharging gas from an inside. The gas adsorbing material 36 is a material to store gas of hydrogen and the like within the inside, and discharges the stored gas by performing heat processing and the like. Instead of installing the gas adsorbing material 36, it is possible to heat the NEG pump 23 and to discharge the gas from the NEG pump 23. Even though the NEG pump 23 is a vacuum pump containing hydrogen, the NEG pump 23 discharges the hydrogen by heating. By controlling the heating unit 23 using the controller 17, it is possible to form the gas adsorbed layer using only the NEG pump 23.

As still another example of a means of spraying gas towards the other electron source, there is a method that may form the gas adsorbed layer by heating a part within the electron gun or a portion thereof, and by accelerating discharging of the gas from the heated part.

The period and timing for discharging the gas is the same as the aforementioned period and timing for forming the gas adsorbed layer and the automation may be performed using the controller 17 according to flashing. Also, the user may discharge a predetermined amount of gas at random timings using the manipulator 19.

By installing the gas supplier 35 or the gas adsorbing material 36, a large amount of gas exists in a local part close to the electron source and thus, it is possible to form the adsorbed layer on the surface of the electron source for a relatively short period of time. Also, it is possible to form the adsorbed layer while suppressing the entire pressure increase in the electron gun chamber. Also, composition of the gas adsorbed layer on the surface may be selected by supplying only specific gas.

According to the present embodiment, compared to the related art, it is possible to obtain an electron beam having a low decreasing speed and little noise in a relatively short waiting time. By using this electron beam, there may be provided the charged particle beam apparatus that may stabilize the current for a long period of time and decrease a frequency of increasing of the extraction voltage or a flashing frequency.

Third Embodiment

Hereinafter, a third embodiment will be described with reference to FIG. 17.

The third embodiment describes a charged particle beam apparatus that may spray hydrogen gas during flashing of an electron source, and clean the surface of the electron source by low temperature flashing. In an SEM including the gas supplier 35 or the gas adsorbing material 36 described in the second embodiment, the electron source 4 may be cleansed by flashing at a temperature lower than the related art, typically, less than 1800 degrees, limitedly less than 1500 degrees, by flashing performed while spraying hydrogen towards the electron source 4. This is because the supplied hydrogen chemically activates carbon-based adsorbed gas that could not be eliminated if it was not heated at the temperature of about 2000 degrees in the related art, to thereby eliminate the carbon-based adsorbed gas from the surface even in the low temperature.

Since the heating temperature in flashing decreases, the front end of the electron source may not easily become dull and thus, the lifespan of the electron source is extended. Also, even the extraction voltage when emitting the electron beam may be fixed, and the axis coordination of the optical system is not required. Also, even though only an electron source of tungsten and the like having a high melting point was used due to a high temperature of flashing, low temperature flashing is enabled and thus, it is possible to use an electron source of a material having a low melting point.

By applying the present embodiment to the method of continuing the bright stable region, described in the first embodiment, by flashing, it is possible to more effectively prevent a front end of an electron source from becoming dull. In this case, the time change of current is shown in FIG. 17. As described above, in the bright stable region, it is possible to continuously use the bright stable region while continuing the observation by repeating flashing at the low temperature of less than 1500 degrees. When a long period of time is elapsed, carbon-based gas starts being adsorbed on the surface of the electron source. The carbon-based adsorbed gas cannot be eliminated by flashing of 1500 degrees. In this case, by stopping the observation once, supplying hydrogen gas to the electron source, and performing flashing at less than 1500 degrees, it is possible to eliminate the carbon-based gas. Since flashing of the electron source may be performed at the temperature of less than 1500 degrees at all times, it is possible to suppress dullness of the front end of the electron source.

An example applied to an SEM is described in the first embodiment to the third embodiment. However, even though the present invention is applied to another charged particle beam apparatus such as an FEG, a transmission electron microscope (TEM), a scanning transmission electron microscope, an analysis apparatus, it is possible to obtain the same effect.

Major points of the present invention, in addition to disclosed in claims, will be briefly described as follows.

A charged particle beam apparatus includes a controller of a heating unit in which when current of electron beam becomes $\alpha I_{(o)}$ with respect to initial value $I_{(o)}$ of current $I_{(t)}$ of the electron beam emitted from a field emission electron source, heating of the field emission electron source is performed and $\alpha \geq 0.95$.

A heating temperature of the field emission electron source of the charged particle beam apparatus is less than 1500 degrees.

A charged particle beam apparatus includes a heating unit of a field emission electron source in which an electron beam is emitted from the field emission electron source while normally keeping heating the field emission electron source at the temperature from 100 degrees to 1000 degrees.

A charged particle beam apparatus includes a controller of a heating unit in which a field emission electron source is heated again every time a predetermined time is elapsed after heating the field emission electron source.

A charged particle beam apparatus includes a controller of a gas adsorbed layer forming unit and a current detector of an electron beam emitted from a field emission electron source in which when current of electron beam becomes $\gamma I_{(o)}$ with respect to initial value $I_{(o)}$ of current $I_{(t)}$ of the electron beam emitted from the field emission electron source, forming of the gas adsorbed layer on the surface of the field emission electron source is terminated and $\gamma \leq 0.2$, particularly, $\gamma \leq 0.1$.

A charged particle beam apparatus includes a controller of a gas adsorbed layer forming unit and a current detector of an electron beam emitted from a field emission electron source in which when a decreasing ratio $[I_{(t)} - I_{(t+ts)}]/I_{(t)}$ of current per time interval $t_s$ becomes to be greater than a predetermined value $\epsilon$ with respect to current $I_{(t)}$ of the electron beam emitted from the field emission electron source, forming of the gas adsorbed layer on the field emission electron source is terminated and $t_s \leq 5$ minutes, and $\epsilon \leq 0.05$.

A charged particle beam apparatus includes a controller of a gas adsorbed layer forming unit in which forming of a gas adsorbed layer on a field emission electron source when a predetermined time is elapsed after heating the field emission electron source is terminated.

INDUSTRIAL APPLICABILITY

The present invention relates to a charged particle beam apparatus such as an electron microscope including a field emission electron gun, and more particularly, to a charged particle beam apparatus for stabilizing the current of an electron beam and a method of controlling the same.

EXPLANATION OF REFERENCE NUMERALS AND SYMBOLS

1 . . . Flashing
2 . . . Increasing of Extraction Voltage
3 . . . Stop of Extraction Voltage
4 . . . Electron Source
5 . . . Filament
6 . . . Electron Gun Chamber
7 . . . First Intermediate Chamber
8 . . . Second Intermediate Chamber
9 . . . Sample Chamber
10 . . . Electron Beam
11 . . . Extraction Electrode
12 . . . Acceleration Electrode
13 . . . Objective Lens
14 . . . Sample
15 . . . Current Detector
16 . . . Flashing Power Source
17 . . . Controller
18 . . . Display
19 . . . Manipulator
20 . . . Ion Pump
21, 22 . . . Ion Pumps
23 . . . Non-Evaporative Getter (NEG) Pump
24 . . . NEG Heating Unit
25 . . . Turbo Molecular Pump
26 . . . Sample Stage
27, 28, 29 . . . Rough Exhaust Valves
30 . . . Electron Gun Heating Unit
31 . . . Aperture Electrode
32 . . . Emission Electron Detector
33 . . . High Voltage Power Source
34 . . . NEG Pump Valve
35 . . . Gas Supplier
36 . . . Gas Adsorbing Material

The invention claimed is:

1. A charged particle beam apparatus including a field emission electron source and an electrode to apply an electric field to the field emission electron source, the apparatus comprising:
a vacuum exhaust unit for maintaining a pressure around the field emission electron source to be less than $1\times10^{-8}$ Pa,
wherein an electron beam having a central radiation angle within $1\times10^{-2}$ sr among electron beams emitted from the field emission electron source is used, and a second order differentiation about a time of current of the electron beam is minus or 0 for at least one hour after flashing of the field emission electron source.

2. The charged particle beam apparatus according to claim 1, comprising:
a non-evaporative getter pump in the vacuum exhaust unit.

3. The charged particle beam apparatus according to claim 1, comprising:
a heating unit of the field emission electron source, and a detector of current of the electron beam,
wherein the field emission electron source is repeatedly heated using the heating unit, and the current of the electron beam emitted from the field emission electron source is maintained greater than a predetermined value using an output of the detector.

4. The charged particle beam apparatus according to claim 3, comprising:
a controller for controlling the heating unit,
wherein the controller controls the heating unit to heat the field emission electron source when the current of the electron beam reaches $\alpha I_{(o)}$ with respect to an initial value $I_{(o)}$ of current $I_{(t)}$ of the electron beam emitted from the field emission electron source, and $\alpha \geq 0.8$.

5. The charged particle beam apparatus according to claim 3, comprising:
a controller for controlling the heating unit,
wherein the controller controls the heating unit to heat the field emission electron source when a decreasing ratio $[I_{(t)}-I_{(t+tc)}]/I_{(t)}$ of current per time interval $t_c$ is greater than a predetermined value $\beta$ with respect to the current $I_{(t)}$ of the electron beam emitted from the field emission electron source, and $t_c \leq 60$ minutes and $\beta \geq 0.01$.

6. The charged particle beam apparatus according to claim 3, wherein a heating temperature of the field emission electron source is less than 2000 degrees.

7. The charged particle beam apparatus according to claim 3, wherein in heating of the field emission electron source, the electron beam is normally emitted from the field emission electron source.

8. The charged particle beam apparatus according to claim 3, comprising:
a manipulator for selecting whether to automatically performing heating of the field emission electron source using the controller; and
a display for displaying a result selected by the manipulator.

9. The charged particle beam apparatus according to claim 1, comprising:
a heating unit of the field emission electron source,
wherein the electron beams emits from the field emission electron source while normally keeping heating the field emission electron source in 1500 degrees or less.

10. A control method of a charged particle beam apparatus including a field emission electron source and an electrode to apply an electric field to the field emission electron source, the method comprising:
maintaining a pressure around the field emission electron source to be less than $1\times10^{-8}$ Pa by a vacuum exhaust unit,
using an electron beam having a central radiation angle within $1\times10^{-2}$ sr among electron beams emitted from the field emission electron source, and
controlling a second order differentiation about a time of current of the electron beam to be minus or 0 for at least one hour after flashing of the field emission electron source.

11. The control method of a charged particle beam apparatus according to claim 10, wherein the field emission electron source is repeatedly heated by a heating unit, and the current of the electron beam emitted from the field emission electron source is maintained to be greater than a predetermined value.

* * * * *